(12) United States Patent
Fukaura (10) Patent No.: US 8,312,770 B2
(45) Date of Patent: Nov. 20, 2012

(54) CAPACITIVE ACCELERATION SENSOR (75) Inventor: Teruya Fukaura, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 676 days.

(21) Appl. No.: 12/119,057

(22) Filed: May 12, 2008

(65) Prior Publication Data
US 2009/0007669 A1 Jan. 8, 2009

(30) Foreign Application Priority Data

Jul. 6, 2007 (JP) .................... 2007-178348

(51) Int. Cl.
G01P 15/125 (2006.01)
(52) U.S. Cl. .................................. 73/514.32
(58) Field of Classification Search .......... 73/514.32, 73/514.36, 514.38, 514.29
See application file for complete search history.

(56) References Cited

U.S. PATENT DOCUMENTS

| | | | | |
|---|---|---|---|---|
| 5,243,861 A * | 9/1993 | Kloeck et al. | ............. | 73/514.32 |
| 5,367,429 A | 11/1994 | Tsuchitani et al. | | |
| 6,230,564 B1 * | 5/2001 | Matsunaga et al. | ........ | 73/514.01 |
| 6,805,008 B2 * | 10/2004 | Selvakumar et al. | ...... | 73/504.14 |
| 6,848,309 B2 * | 2/2005 | Sakai | ......................... | 73/514.32 |
| 6,906,394 B2 * | 6/2005 | Muto et al. | .................... | 257/415 |
| 7,331,228 B2 * | 2/2008 | Fukaura et al. | ............ | 73/514.16 |
| 2004/0011130 A1 | 1/2004 | Bauer et al. | | |
| 2004/0025589 A1* | 2/2004 | Kurle et al. | ..................... | 73/488 |
| 2004/0187592 A1 | 9/2004 | Sugiura | | |

FOREIGN PATENT DOCUMENTS

| | | |
|---|---|---|
| DE | 100 38 099 A1 | 2/2002 |
| DE | 100 40 537 A1 | 3/2002 |
| DE | 10 2004 015 237 A1 | 10/2004 |
| JP | 5-172846 | 7/1993 |
| JP | 6-213924 | 8/1994 |
| JP | 7-245416 | 9/1995 |
| JP | 9-105760 | 4/1997 |
| JP | 9-127151 | 5/1997 |
| JP | 9-329621 | 12/1997 |
| JP | 2000-187041 | 7/2000 |
| JP | 2001-133479 | 5/2001 |
| JP | 2001153882 A | 6/2001 |
| JP | 2002-98710 | 4/2002 |
| JP | 2002-151703 | 5/2002 |
| JP | 2006-133245 * | 5/2006 |

OTHER PUBLICATIONS

Office Action issued Sep. 20, 2011, in Japanese Patent Application No. 2007-178348 (with English-language translation).
Japanese Office Action mailed on Apr. 24, 2012, issued for JP Application No. 2007-178348, filed on Jul. 6, 2007 (with English translation).

* cited by examiner

*Primary Examiner* — Helen C. Kwok
(74) *Attorney, Agent, or Firm* — Oblon, Spivak, McClelland, Maier & Neustadt, L.L.P.

(57) ABSTRACT

A capacitive acceleration sensor that prevents sticking of a mass body, made of silicon, to a first sealing substrate or a second sealing substrate, made of glass. The capacitive acceleration sensor includes a first sealing substrate and a second sealing substrate each made of glass. The mass body is suspended between the first and second sealing substrates by a beam attached to a substrate, and one or both of the sealing substrates is processed such that the mass body only contacts with a subsection of the substrate surface.

9 Claims, 7 Drawing Sheets

CAPACITIVE ACCELERATION SENSOR

BACKGROUND OF THE INVENTION

1. Field of the Invention

The present invention relates to acceleration sensors, especially to capacitive acceleration sensors.

2. Description of the Related Art

A capacitive acceleration sensor has stable temperature characteristics, as well as excellent features in that its sensitivity and accuracy can be easily improved, and so forth. Therefore, a demand of installing such a sensor into a vehicle has been increased, where excellent temperature characteristics and high-accuracy characteristics are required. For example, the capacitive acceleration sensor is used for detecting impact force on an air bag system installed in a vehicle.

A capacitive acceleration sensor, for example, is disclosed in Japanese Laid-Open Patent Publication No. 2001-133479 (Paragraph 0031, FIG. 8), which includes on a silicon substrate, an anchor and a mass body that are made of silicon, a beam, provided between the anchor and the mass body, for supporting the mass body in the air, by forming a space between the mass body and the silicon substrate, fixed electrodes arranged in both sides of the mass body so as to form a space, and a sub-support member arranged so as to surround the periphery of these anchor, beam, mass body, and fixed electrodes; a glass substrate is mounted on the sub-support member so as to form a space for the mass body and the beam; and the substrate and the sub-support member are anodically bonded with each other.

By the way, when the sub-support member and the glass substrate are anodically bonded with each other, the mass body is grounded, and a voltage is applied to the glass substrate. Therefore, due to potential difference occurring between the mass body and the glass substrate, a problem has occurred that the mass body is drawn and stuck to the glass substrate, which has been one of factors for decreasing a production yield.

A method of preventing the problem that the mass body is stuck to the glass substrate, for example, is disclosed in Japanese Laid-Open Patent Publication No. 2002-151703 (Paragraphs 0026 and 0027, FIG. 1), in which a metal film such as an aluminum film is provided on the glass-substrate surface facing the mass body.

SUMMARY OF THE INVENTION

However, in a case where a metal film such as an aluminum film is provided on a portion, facing the mass body, of the glass substrate, a film formation process for forming the metal film is additionally required. Therefore, equipment such as film-formation equipment has to be newly prepared. The introduction of such new equipment and production process may cause decrease of the production yield.

As another method of preventing the sticking of the mass body to the glass substrate, the space between the mass body and the glass substrate can also be considered to be simply increased to a level at which the sticking does not occur.

However, in a case where the space between the mass body and the glass substrate is increased, due to vibration or impact during the production or the transport process, the mass body may be excessively displaced; consequently, the beam supporting the mass body may be destroyed. Therefore, the space between the mass body and the glass substrate is preferable to be as small as possible; thus, because the increase of this space leads to decrease of the production yield, the increase is not preferable. Meanwhile, if the space between the mass body and the glass substrate is decreased, as described above, the mass body is stuck to the glass substrate.

An objective of the present invention, which is made in view of the above problems, is to provide a capacitive acceleration sensor in which sticking of a mass body to a glass substrate can be prevented without forming a metal film as a sticking-prevention film, and thereby, improvement of the production yield can be realized.

A capacitive acceleration sensor according to the present invention, including a first sealing substrate and a second sealing substrate each made of glass, contains therebetween: an acceleration detecting portion, made of silicon, including a mass body supported in the air to have predetermined gaps each to the first sealing substrate and the second sealing substrate, a beam, connected to the mass body for supporting the mass body in the air, having elasticity to enable the mass body with a predetermined gap thereto; and a bonding frame, made of silicon, provided so as to surround the periphery of the acceleration detecting portion, in which at least one of the first sealing substrate and the second sealing substrates includes, at a position thereof facing the mass body, a contact portion with which a part of the mass body comes in contact.

According to the present invention, because the contact portion, or portions, with which the part of the mass body comes into contact has been provided on the first sealing substrate or the second sealing substrate, or the first sealing substrate and the second sealing substrate, towards which the mass body is displaced so that a formation area of the contact portion with the mass body decreases when the mass body is displaced towards the first or the second sealing substrate, the sticking force when the mass body is stuck to the first or the second sealing substrate can be decreased. Therefore, the sticking of the mass body to the first or the second sealing substrate can be prevented without the formation of the metal film as the sticking-prevention film, and the production yield can be improved.

DETAILED DESCRIPTION OF THE PREFERRED EMBODIMENT

Embodiment 1

Figure 1:
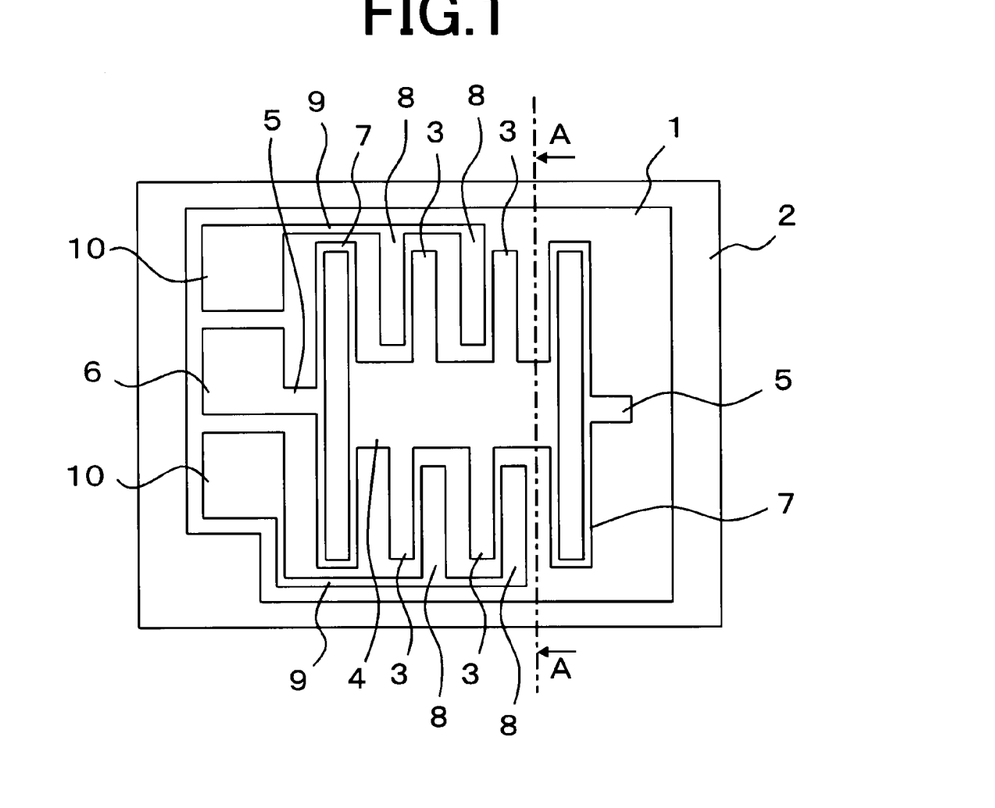
FIG. 1 is a plan view illustrating a capacitive acceleration sensor according to Embodiment 1 of the present invention.
Figure 2:
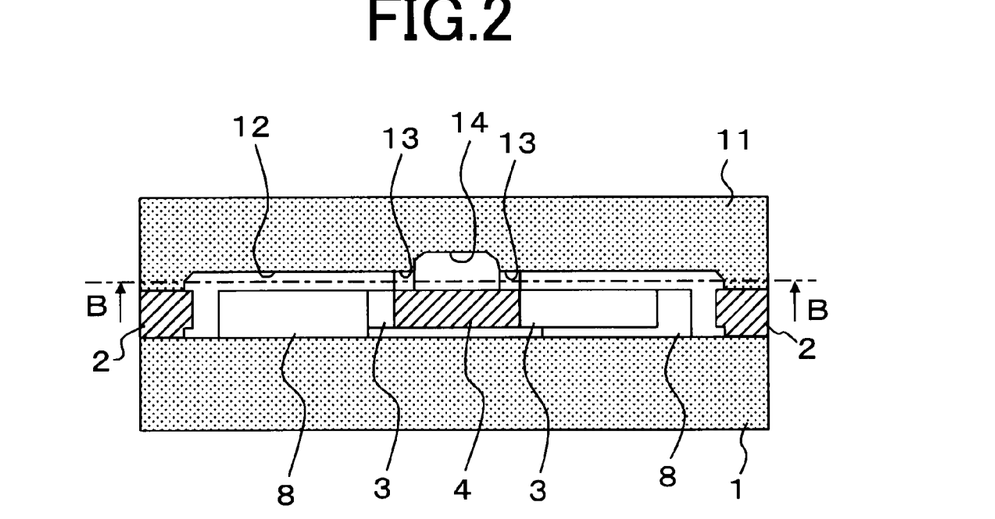
FIG. 2 is a cross-sectional view illustrating the capacitive acceleration sensor according to Embodiment 1 of the present invention.

Embodiment 1 according to the present invention is explained. FIG. 1 is a top view illustrating a capacitive acceleration sensor according to Embodiment 1 of the present invention. FIG. 2 is a cross-sectional view illustrating the capacitive acceleration sensor according to Embodiment 1 of the present invention. In FIG. 2, the cross section along the A-A line in FIG. 1 is represented. Here, in FIG. 1, in order to represent the internal structure of the sensor, the structure of the sensor without a second sealing substrate described later is illustrated.

As represented in FIG. 1 and FIG. 2, an acceleration detecting portion for detecting acceleration, and a bonding frame 2 arranged so as to surround the acceleration detecting portion are provided on the principal surface of a first sealing substrate 1 made of glass or silicon. The acceleration detecting portion and the bonding frame 2 are formed of silicone.

The acceleration detecting portion is configured by a mass body 4 as a movable electrode provided with a comb-shaped electrode 3 in the sides of the mass body, mass-body supports 5, a first electrode pad 6 connected to one of the mass-body supports 5, beams 7 having elasticity for enabling displacement of the mass body 4 by connecting the mass body 4 with the mass-body supports 5 and supporting the mass body 4 in a space, a fixed electrode 8 arranged to face the mass body 4, specifically to face the comb-shaped electrode 3 of the mass body 4, having a predetermined gap, a fixed-electrode support 9 connected to the fixed electrode 8, and a second electrode pad 10 connected to the fixed-electrode support 9. Here, the mass-body supports 5, the first electrode pad 6, fixed electrode 8, the fixed-electrode support 9, and the second electrode pad 10 are bondedly fixed to the principal surface of the first sealing substrate 1.

In order to cover the acceleration detecting portion to isolate from the outside air, a second sealing substrate 11 made of glass is provided on the bonding frame 2. The second sealing substrate 11 is fixed to the bonding frame 2 by an anodic bonding method. In the second sealing substrate 11, a dent 12 is provided so as to have a predetermined space at least to the mass body 4 and the beams 7 of the acceleration detecting portion. Moreover, in the second sealing substrate 11, a contact portion 13 is a contact position when the mass body 4 is displaced towards the second sealing substrate 11, for example, when the anodic bonding is performed; that is, the contact portion 13 corresponds to a position where the mass body 4 is stuck to the second sealing substrate 11. In Embodiment 1, a concavity 14 is provided at a position where the second sealing substrate 11 faces the mass body 4, and the peripheral portion of the mass body 4, specifically at least a part of the peripheral portion thereof, is configured to come into contact with the second sealing substrate 11.

Figure 3:
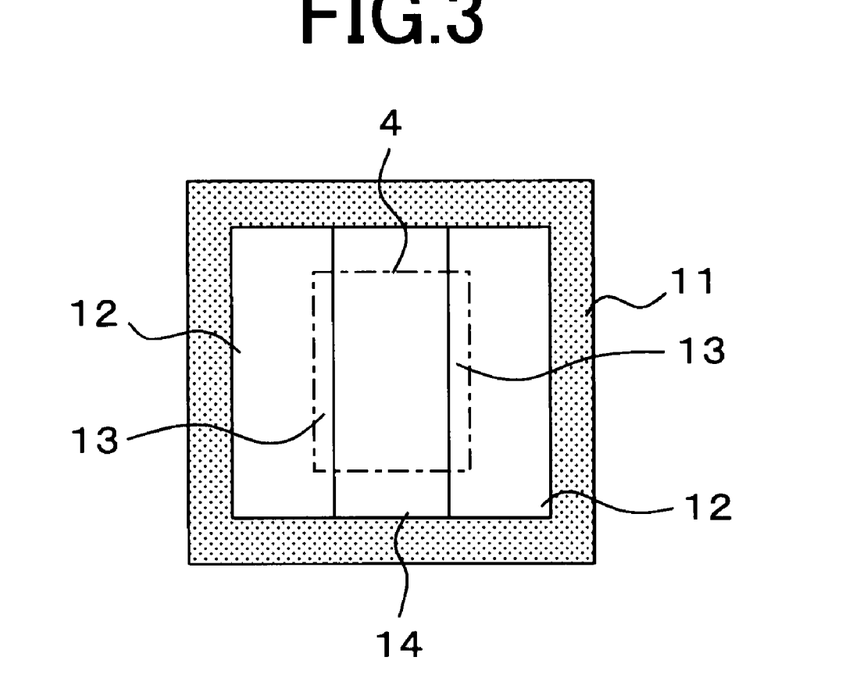
FIG. 3 is an explanatory view illustrating an example of a concavity provided in a second sealing substrate of the capacitive acceleration sensor according to Embodiment 1 of the present invention.
Figure 4:
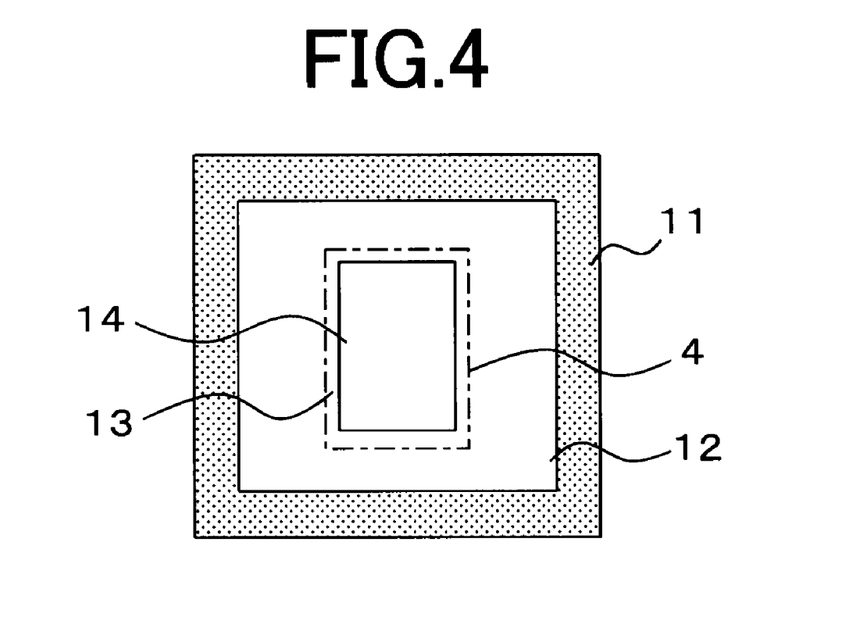
FIG. 4 is an explanatory view illustrating another example of the concavity provided in the second sealing substrate of the capacitive acceleration sensor according to Embodiment 1 of the present invention.
Figure 5:
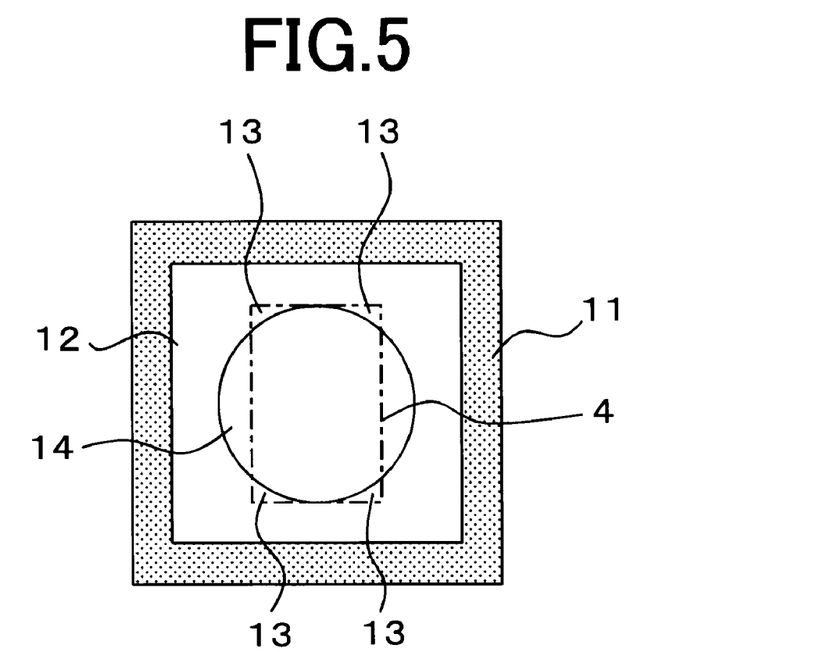
FIG. 5 is an explanatory view illustrating still another example of the concavity provided in the second sealing substrate of the capacitive acceleration sensor according to Embodiment 1 of the present invention.

Regarding the shape of the concavity 14, for example, a belt-like one illustrated in FIG. 3, a rectangular one illustrated in FIG. 4, and a circular one illustrated in FIG. 5 can be presented. FIG. 3 through FIG. 5 are explanatory views representing examples of the shapes of the concavity 14, which represent the cross section along the B-B line in FIG. 2. Here, the mass body 4 is indicated by alternate long and short dash lines in FIG. 3 through FIG. 5. While, areas where the mass body 4 and the second sealing substrate 11, except for the concavity 14, overlap with each other corresponds to the contact portions 13.

The capacitive acceleration sensor illustrated in FIG. 1 and FIG. 2 is produced using a semiconductor manufacturing technique.

After a silicon wafer, on which at least forming portions of the mass body 4 and the beams 7 of the acceleration detecting portion (the forming portion of the acceleration detecting portion in FIG. 2) are formed by concave etching on the principal surface of the first sealing substrate 1 made of glass including silicon dioxide ($SiO_2$) or silicon, so as to have a predetermined space (for example, a space of approximately 2-3 μm) against the first sealing substrate 1, has been arranged in such a way that the concavity faces the first sealing substrate 1, the silicon wafer and the first sealing substrate is bondedly fixed to each other. The bonding between the first sealing substrate 1 and the silicon wafer is performed, for example, in a case in which the first sealing substrate 1 is made of glass, using the anodic-bonding technique by a negative voltage being applied to the first sealing substrate 1, and the silicon wafer being grounded, with the first sealing substrate 1 being heated.

Next, using a surface polishing technique, a photo-lithography technique, and an etching technique, etc., for processing the silicon wafer, the bonding frame 2, the mass body 4 (including the comb-shaped electrode 3), the mass-body supports 5, the first electrode pad 6, the beams 7, the fixed electrode 8, the fixed-electrode support 9, and the second electrode pad 10 are formed at a predetermined thickness (for example, a thickness of approximately 40-50 μm).

Next, the second sealing substrate 11 made of glass including silicon dioxide ($SiO_2$) is mounted on the bonding frame 2. This second sealing substrate 11 is used to cover the acceleration detecting portion, and to ensure the movable space of the mass body 4.

The dent 12 is formed on the second sealing substrate 11 so that the portions of the acceleration detecting portion in which at least the mass body 4 including the comb-shaped electrode 3, and the beams 7 are formed have a predetermined gap (for example, a gap of approximately 20-40 μm) against the second sealing substrate 11. Regarding the predetermined gap, as one of the conditions, the gap is needed to be within a range where the mass body 4 can be displaced towards the second sealing substrate 11 without breakage; that is, the gap is needed to be a distance where the mass body 4 comes into contact with the second sealing substrate 11. In FIG. 2, the concave dent 12 is formed so that the forming portion of the acceleration detecting portion has a predetermined gap against the second sealing substrate 11. The dent 12 can be formed, for example, using a sandblast.

Moreover, the concavity 14 is formed at a position, facing the mass body 4, of the second sealing substrate 11, in such a way that at least a part of the peripheral portion of the mass body 4 comes into contact with the contact portion 13 represented in FIG. 2, when the mass body 4 is displaced towards the second sealing substrate 11, and then comes into contact with the second sealing substrate 11. This concavity 14 can be formed, for example, using a sandblast similarly to the case of the dent 12. When the dent 12 and the concavity 14 are formed, the same tool therefor can be used.

Last, by the silicon wafer, on which the acceleration detecting portion and the bonding frame 2 are formed, being grounded, and a negative voltage being applied to the second sealing substrate 11 with the second sealing substrate 11 being heated, the bonding frame 2 and the second sealing substrate 11 are fixed to each other by the anodic-bonding technique. According to the above procedure, the capacitive acceleration sensor represented in FIG. 1 and FIG. 2 is completed.

Here, when the anodic bonding is performed, due to the potential difference generated between the mass body 4 and the second sealing substrate 11, the mass body 4 is displaced towards the second sealing substrate 11, and intended to be stuck to the second sealing substrate 11. However, regarding the mass body 4, only the peripheral portion of the mass body 4, specifically at least the part of the peripheral portion thereof, comes into contact with the contact portion 13 of the second sealing substrate 11. Thereby, the sticking force is decreased when the mass body 4 is stuck to the second sealing substrate 11. Therefore, the sticking of the mass body 4 to the second sealing substrate 11 can be prevented.

In the capacitive acceleration sensor formed as above, the mass body 4 is displaced due to the beam bending when acceleration is added thereto; consequently, the interelectrode distance between the mass body 4 and the fixed electrode 8, specifically between the comb-shaped electrode 3 of the mass body 4 and the fixed electrode 8 varies. If the electrode distance varies, the capacitance between the mass body 4 and the fixed electrode 8 also varies. Accordingly, by detecting the variation of the capacitance between the mass body 4 and the fixed electrode 8, the acceleration can be detected. Here, the variation of the capacitance between the mass body 4 and the fixed electrode 8 is outputted to the exterior thereof, using the first electrode pad 6 and the second electrode pad 10.

In the capacitive acceleration sensor according to Embodiment 1 of the present invention, the concavity 14 has been provided at the position, facing the mass body 4, of the second sealing substrate 11, and, regarding the contact portion 13 of the second sealing substrate 11 contacting when the mass body 4 is displaced towards the second sealing substrate 11, the peripheral portion of the mass body 4 has been configured to come into contact therewith; therefore, the sticking force is decreased when the mass body 4 is stuck to the second sealing substrate 11. Accordingly, the sticking of the mass body 4 to the second sealing substrate 11 can be prevented. Moreover, according to Embodiment 1, because excessive displacement of the mass body is prevented, the beams supporting the mass body are never destroyed caused by vibration or impact during the production or the transport process.

Using the capacitive acceleration sensor as described above, the sticking of the mass body 4 to the second sealing substrate 11 can be prevented; however, in order to more securely prevent the sticking of the mass body 4 to the second sealing substrate 11, the concavity 14 is desired to be configured as follows.

A formation area of the concavity 14, that is, a formation area of the contact portion 13 in which the mass body 4 comes into contact with the second sealing substrate 11 is determined, at the position where the mass body 4 comes into contact with the second sealing substrate 11, in such a way that the sticking force by which the mass body 4 is stuck to the second sealing substrate 11 becomes lower than the recovery force, due to the elasticity of the beams 7, that is intended for taking the mass body 4 away from the contact position and setting it back to a predetermined position. Here, the predetermined position corresponds to a position where the mass body 4 is displaced towards neither the first sealing substrate 1 nor the second sealing substrate 11, and presents a position where the function occurs as a capacitive acceleration sensor.

Figure 6:
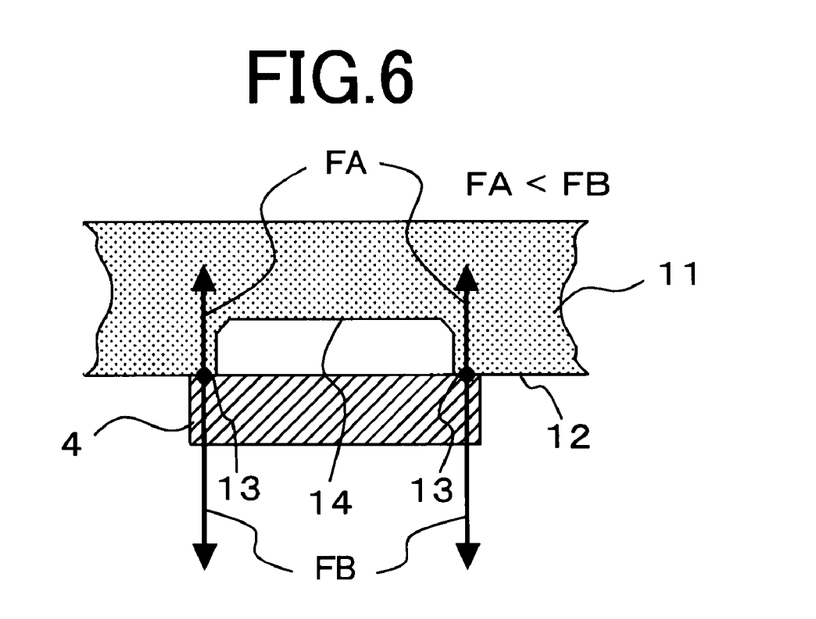
FIG. 6 is an explanatory view explaining a relationship between sticking force and recovery force applied to a movable electrode of the capacitive acceleration sensor according to Embodiment 1 of the present invention.

That is, as illustrated in FIG. 6, at the position where the mass body 4 comes into contact with the second sealing substrate 11, the range in which the mass body 4 comes into contact with the second sealing substrate 11 (the formation area of the contact portion 13), that is, the formation area of the concavity 14 is determined so as to have a relationship of the sticking force (FA)<the recovery force (FB). According to this procedure, the sticking of the mass body 4 to the second sealing substrate 11 can be more securely prevented. Here, FIG. 6 is an explanatory view explaining a relationship between the sticking force and the recovery force generated in the mass body 4.

Moreover, the depth of the concavity 14 is set to a depth at which the mass body 4 can be prevented from coming into contact with the bottom face of the concavity 14 due to bending of the mass body 4 when the mass body 4 comes into contact with the second sealing substrate 11. However, because the mass body 4 is formed of silicon, which is rigid, this bending needs to be little considered.

Because various capacitive acceleration sensors are used, the formation area and the depth of this concavity 14 should be determined corresponding to each of the capacitive acceleration sensors; therefore, the values thereof are easily obtained by an experiment and calculation, etc.

As described above, in the capacitive acceleration sensor according to Embodiment 1, by providing the concavity 14 at the position where the second sealing substrate 11 faces the mass body 4, the contact portion 13 of the second sealing substrate 11 with which the mass body 4 comes into contact, when the mass body 4 is displaced towards the second sealing substrate 11, has been configured in such a way that the peripheral portion, specifically a part of the peripheral portion, of the mass body 4 comes into contact with the second sealing substrate 11; therefore, the sticking force, for example, being generated by the anodic bonding of the second sealing substrate 11 to the bonding frame 2, in which the mass body 4 is intended to be stuck to the second sealing substrate 11 decreases. Accordingly, the sticking of the mass body 4 to the second sealing substrate 11 can be prevented. Therefore, the yield of the product is improved. Moreover, according to Embodiment 1, because excessive displacement of the mass body 4 is prevented, the beams 7 supporting the mass body 4 is never destroyed caused by vibration or impact during the production or the transport process. Accordingly, the production yield can be more improved. Moreover, the concavity 14 can also be formed by the sandblast method, etc. used when the dent 12 of the second sealing substrate 11 is formed; therefore, neither new facilities nor new processes need to be added, and existing facilities and processes can be utilized. Accordingly, the production cost can be reduced in addition to the improvement of the production yield.

Moreover, in the capacitive acceleration sensor according to Embodiment 1, at the position where the mass body 4 comes into contact with the second sealing substrate 11, the contact portion 13 of the second sealing substrate 11 has been set so that the sticking force by which the mass body 4 is stuck to the second sealing substrate 11 becomes lower than the recovery force, due to the elasticity of the beams 7, that is intended for taking the mass body 4 away from the contact position and setting it back to the predetermined position; therefore, the sticking of the mass body 4 to the second sealing substrate 11 can be more securely prevented. Accordingly, the production yield is more improved.

In Embodiment 1, the configuration has been represented in which the concavity 14 is provided in such a way that only the peripheral portion of the mass body 4 comes into contact with the second sealing substrate 11. In the production process represented in Embodiment 1, the anodic bonding is performed between the second sealing substrate 11 and the bonding frame 2, after the mass body 4 has been formed; therefore, the explanation has been performed as means for preventing that the mass body 4 being possible to be displaced, when the anodic bonding is performed, is displaced towards the second sealing substrate 11 and stuck thereto.

Figure 7:
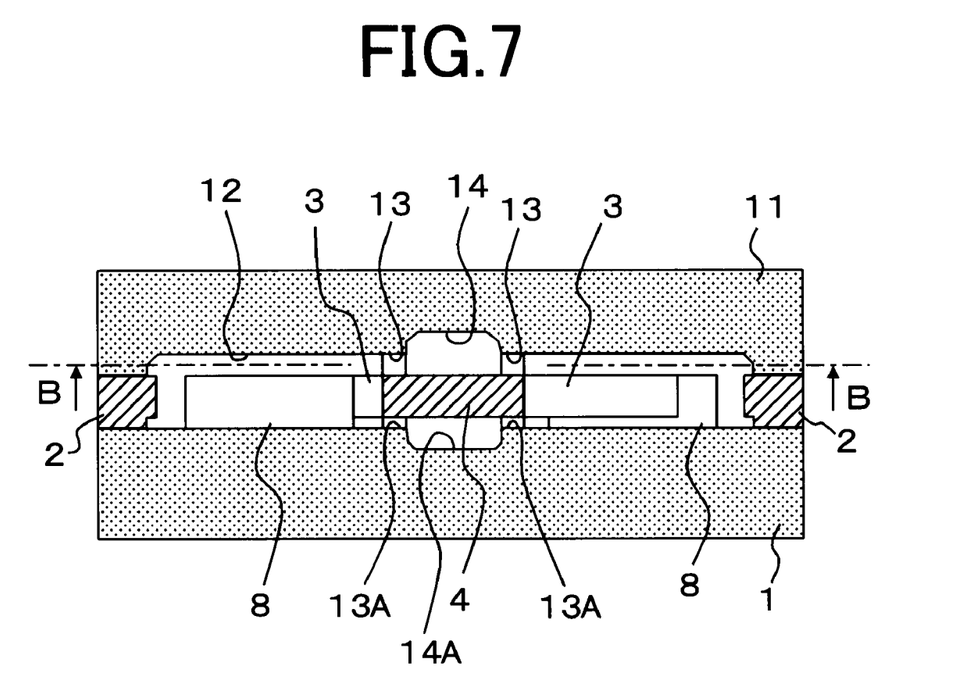
FIG. 7 is a cross-sectional view illustrating another example of the capacitive acceleration sensor according to Embodiment 1 of the present invention.

However, in a case of the first sealing substrate 1 being made of glass, when the first sealing substrate 1 and the bonding frame 2 are anodically bonded with each other, if the mass body 4 has already been formed, the mass body 4 is considered to be displaced towards the first sealing substrate 1 and stuck thereto. In such case, as illustrated in FIG. 7, a concavity 14A may be provided so that only the peripheral portion of the mass body 4 comes into contact with the first sealing substrate 1 (a contact portion is denoted by symbol 13A).

In conclusion, due to the sticking force generated by the anodic bonding of the bonding frame 2 with the second sealing substrate 11 or with the first sealing substrate 1, in a case in which the mass body 4 is displaced towards the second sealing substrate 11, the concavity 14 is formed in the second sealing substrate 11, and the contact portion 13 with which the peripheral portion of the mass body 4 comes into contact is provided. While, in a case in which the mass body 4 is displaced towards the first sealing substrate 1, the concavity 14A is formed in the first sealing substrate 1, and the contact portion 13A with which the peripheral portion of the mass body 4 comes into contact is provided. Moreover, in a case in which the mass body 4 is displaced towards both of the second sealing substrate 11 and the first sealing substrate 1, the concavities 14 and 14A are formed in the second sealing substrate 11 and the first sealing substrate 1, respectively, and the contact portions 13 and 13A, with which the peripheral portion of the mass body 4 comes into contact, may be provided, respectively. Similar effect to that represented in Embodiment 1 can also be obtained in both cases.

Moreover, in Embodiment 1, means for preventing the mass body 4 from being stuck to the second sealing substrate 11 or to the first sealing substrate 1 due to potential difference, which is generated when the anodic bonding is performed, between the mass body 4 and the second sealing substrate 11 or the first sealing substrate 1, has been specifically described. However, also in a case in which, caused by any factor, limited not by the anodic bonding, but, for example, by static electricity generated during the production or the transport process, the potential difference is generated between the mass body 4 and the second sealing substrate 11 or the first sealing substrate 1, and consequently, the sticking force towards the second sealing substrate 11 or the first sealing substrate 1 acts on the mass body 4, it is needless to say that the measure proposed here may effectively operates.

Embodiment 2

Figure 8:
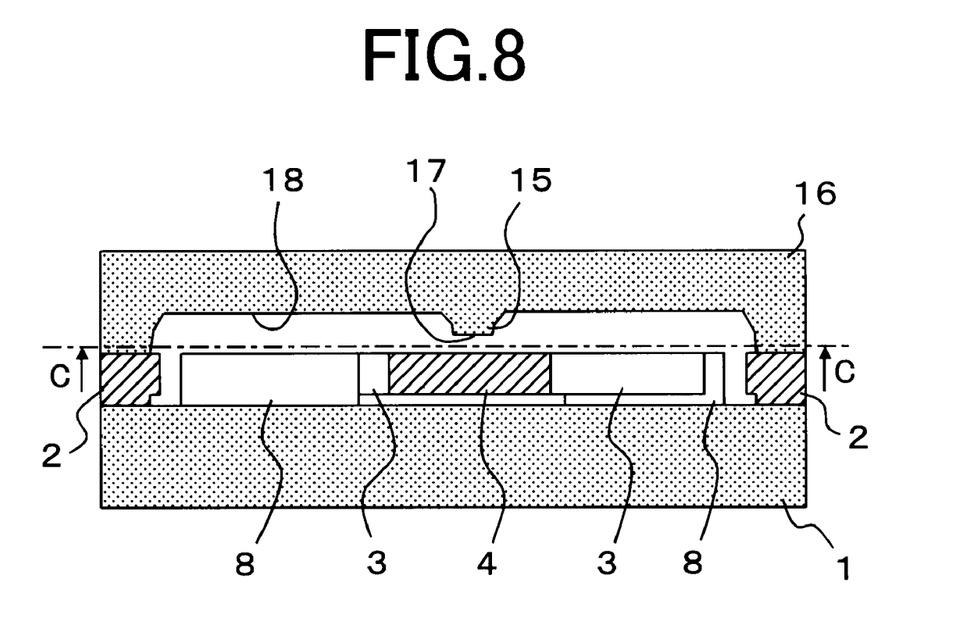
FIG. 8 is a cross-sectional view illustrating a capacitive acceleration sensor according to Embodiment 2 of the present invention.

Embodiment 2 according to the present invention is explained. FIG. 8 is a cross-sectional view of a capacitive acceleration sensor according to Embodiment 2 of the present invention. In FIG. 8, the cross section along the A-A line of the capacitive acceleration sensor in FIG. 1 is represented.

In Embodiment 1, the concavity 14 has been provided at the position where the second sealing substrate 11 faces the mass body 4, and the contact portion 13, where the mass body 4 comes into contact with the second sealing substrate 11 when the mass body 4 is displaced towards the second sealing substrate 11, of the second sealing substrate 11 has been configured in such a way that the peripheral portion of the mass body 4 comes into contact with the second sealing substrate 11. According to Embodiment 2, the peripheral portion of the mass body 4 does not come into contact with the second sealing substrate 11, but the center of the mass body 4 comes into contact with the second sealing substrate 11; thus, this point is different from that in Embodiment 1.

Specifically, instead of providing, as represented in Embodiment 1, the concavity 14 at the position where the second sealing substrate 11 faces the mass body 4, and of providing the contact portion 13 of the second sealing substrate 11 with which the peripheral portion of the mass body 4 comes into contact, a second sealing substrate 16 having a protrusion 15 protruded towards the mass body 4 is provided so as to come into contact with the center of the mass body 4. The top of the protrusion 15 becomes a contact portion 17 with which the mass body 4 comes into contact when the mass body 4 is displaced towards the second sealing substrate 16. The gap between the contact portion 17 of the protrusion 15 and the mass body 4, when the mass body 4 is not displaced towards the second sealing substrate 16, has a predetermined width (for example, the gap width of approximately 20-40 μm). Moreover, a dent 18 having the bottom that agrees with the hemline of the protrusion 15 is provided between the protrusion 15 of the second sealing substrate 16 and the bonding frame 2. The dent 18 must be formed at least in an area that faces the mass body 4 and the beams 7 of the acceleration detecting portion face. Here, the second sealing substrate 16 is made of silicon dioxide glass. The other configurations are the same as those represented in FIG. 1 and FIG. 2 according to Embodiment 1; therefore, the same symbols are given to the same components, and their explanation is omitted.

Figure 9:
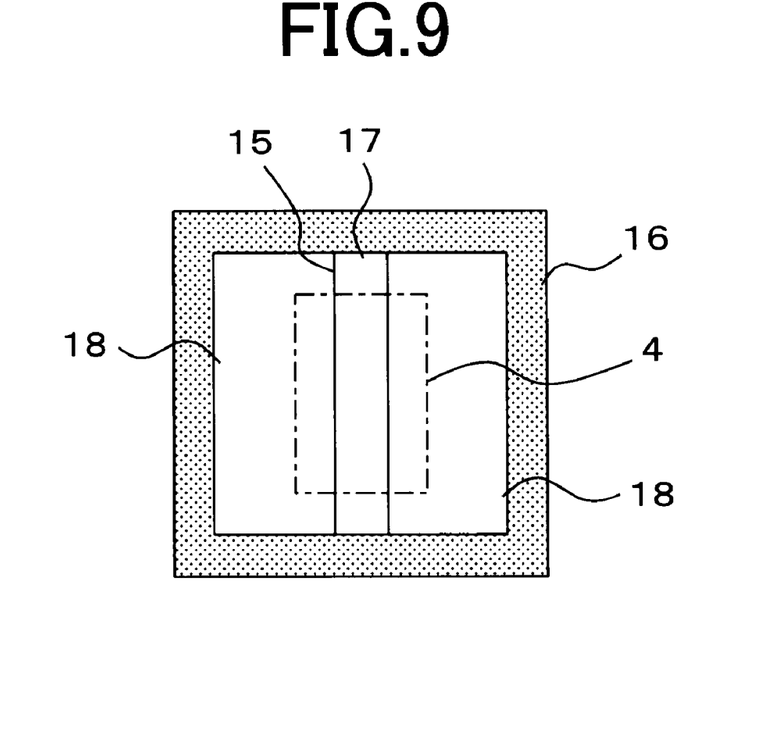
FIG. 9 is an explanatory view illustrating an example of a protrusion provided on a second sealing substrate of the capacitive acceleration sensor according to Embodiment 2 of the present invention.
Figure 10:
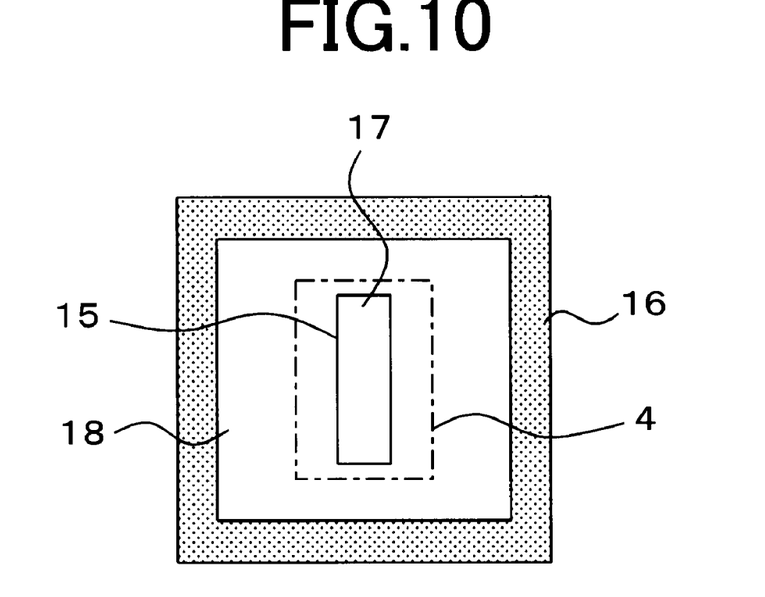
FIG. 10 is an explanatory view illustrating another example of the protrusion provided on the second sealing substrate of the capacitive acceleration sensor according to Embodiment 2 of the present invention.
Figure 11:
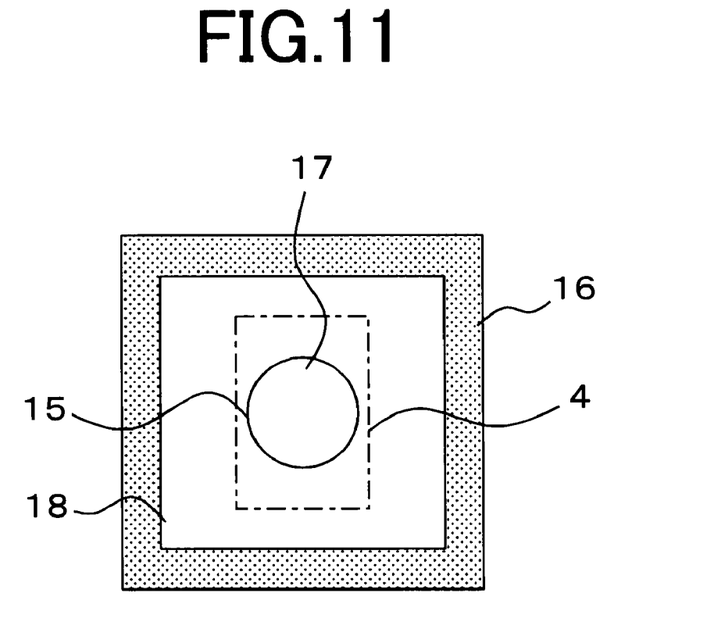
FIG. 11 is an explanatory view illustrating another example of the protrusion provided on the second sealing substrate of the capacitive acceleration sensor according to Embodiment 2 of the present invention.
Figure 12:
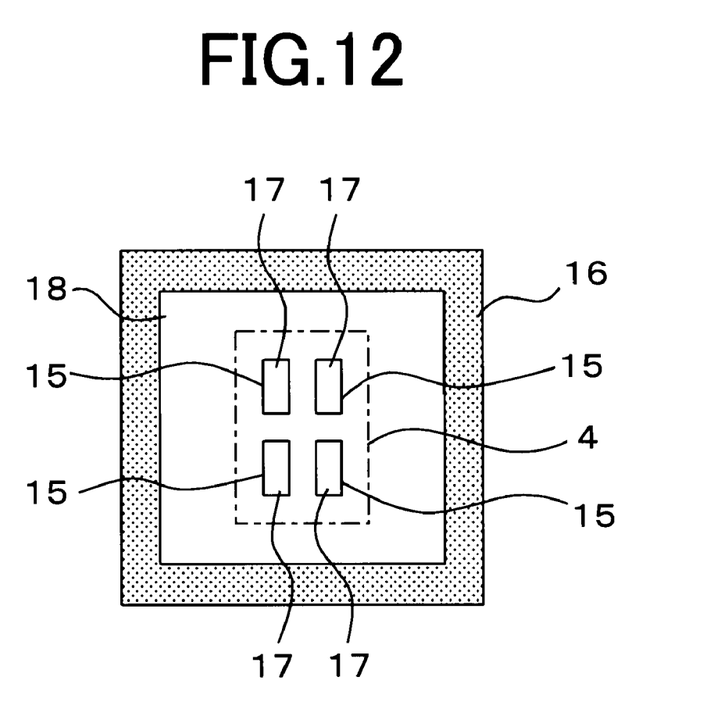
FIG. 12 is an explanatory view illustrating still another example of the protrusion provided on the second sealing substrate of the capacitive acceleration sensor according to Embodiment 2 of the present invention.

As the shape of the protrusion 15, for example, a belt-like one illustrated in FIG. 9, a rectangular one illustrated in FIG. 10, a circular one illustrated in FIG. 11, or a plural-rectangular one illustrated in FIG. 11 can be considered. FIG. 9 through FIG. 12 are explanatory views representing shape examples of the protrusion 15, which represent the cross section along the C-C line in FIG. 8. Here, the mass body 4 is represented by alternate long and short dash lines in FIG. 9 through FIG. 12. Moreover, a position where the mass body 4 and the protrusion 15 of the second sealing substrate 16 overlap with each other corresponds to the contact portion 17.

In the capacitive acceleration sensor represented in FIG. 8, the protrusion 15 and the dent 18 can be formed using, for example, a sandblast. The same equipment can be used for processing the protrusion 15 and the dent 18.

Thus, with the silicon wafer, on which the acceleration detecting portion and the bonding frame 2 are formed, being grounded, and by a negative voltage being applied to the second sealing substrate 16 with being heated, the bonding frame 2 is fixed to the second sealing substrate 16 by the anodic bonding; consequently, the capacitive acceleration sensor represented in FIG. 8 is completed. The other forming procedures of the capacitive acceleration sensor represented in FIG. 8 are the same as those represented in Embodiment 1; therefore, the explanation is omitted here.

Here, when the anodic bonding is performed, due to the potential difference generated between the mass body 4 and the second sealing substrate 16, the mass body 4 is displaced towards the second sealing substrate 16, and intended to be stuck to the second sealing substrate 16. However, regarding the mass body 4, only the center of the mass body 4 comes into contact with the contact portion 17 of the protrusion 15 provided on the second sealing substrate 16. Thereby, the sticking force is decreased when the mass body 4 is stuck to the second sealing substrate 16. Therefore, the sticking of the mass body 4 to the second sealing substrate 16 can be prevented.

In the capacitive acceleration sensor formed as above, the mass body 4 is displaced due to the beam bending when acceleration is added thereto; consequently, the interelectrode distance between the mass body 4 and the fixed electrode 8, specifically between the comb-shaped electrode 3 of the mass body 4 and the fixed electrode 8 varies. If the electrode distance varies, the capacitance between the mass body 4 and the fixed electrode 8 also varies. Accordingly, by detecting the variation of the capacitance between the mass body 4 and the fixed electrode 8, the acceleration can be detected. Here, the variation of the capacitance between the mass body 4 and the fixed electrode 8 is outputted to the exterior thereof, using the first electrode pad 6 and the second electrode pad 10.

In the capacitive acceleration sensor according to Embodiment 2 of the present invention, the protrusion 15 protruding towards the mass body 4 has been provided at the position facing the approximate center of the mass body 4 of the second sealing substrate 16, and regarding the contact portion 17 of the second sealing substrate 16 contacting when the mass body 4 is displaced towards the second sealing substrate 16, the center of the mass body 4 has been configured to come into contact therewith; therefore, the sticking force is decreased when the mass body 4 is stuck to the second sealing substrate 16, and consequently, the sticking of the mass body 4 to the second sealing substrate 16 can be prevented. Moreover, according to Embodiment 2, because excessive displacement of the mass body is prevented, the beams supporting the mass body are never destroyed caused by vibration or impact during the production or the transport process.

Using the capacitive acceleration sensor as described above, the sticking of the mass body 4 to the second sealing substrate 16 can be prevented; however, in order to more securely prevent the sticking of the mass body 4 to the second sealing substrate 16, the protrusion 15 is desired to be configured as follows.

A formation area of the contact portion 17 that is the top of the protrusion 15, with which the mass body 4 comes into contact, is determined, at the position where the mass body 4 comes into contact with the second sealing substrate 16, so that the sticking force by which the mass body 4 is stuck to the second sealing substrate 16 becomes lower than the recovery force, due to the elasticity of the beams 7, that is intended for taking the mass body 4 away from the contact position and setting it back to a predetermined position. Here, the predetermined position corresponds to a position where the mass body 4 is displaced towards neither the first sealing substrate 1 nor the second sealing substrate 16, and presents a position where the function occurs as a capacitive acceleration sensor.

Figure 13:
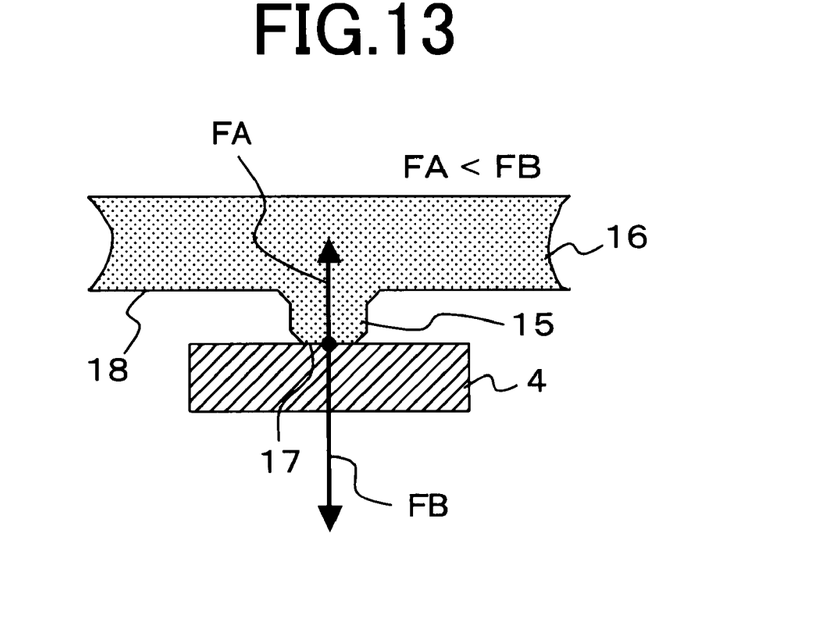
FIG. 13 is an explanatory view explaining a relationship between sticking force and recovery force applied to a movable electrode of the capacitive acceleration sensor according to Embodiment 2 of the present invention.

That is, as illustrated in FIG. 13, at the position where the mass body 4 comes into contact with the second sealing substrate 16, the range in which the mass body 4 comes into contact with the protrusion 15 of the second sealing substrate 16, specifically, the formation area of the contact portion 17 of the protrusion 15, is determined so as to have a relationship of the sticking force (FA)<the recovery force (FB). According to this procedure, the sticking of the mass body 4 to the second sealing substrate 16 can be more securely prevented. Here, FIG. 13 is an explanatory view explaining a relationship between the sticking force and the recovery force generated in the mass body 4.

Moreover, the depth of the dent 18 is set to a depth at which the mass body 4 can be prevented from coming into contact with the bottom face of the dent 18 due to bending of the mass body 4 when the mass body 4 comes into contact with the protrusion 15. However, because the mass body 4 is formed of silicon, which is rigid, this bending needs to be little considered.

Because various capacitive acceleration sensors are used, the formation area of the contact portion 17 of the protrusion 15 and the depth of the dent 18 should be determined corresponding to each of the capacitive acceleration sensors; therefore, the values thereof should be easily obtained by an experiment or calculation, etc.

As described above, in the capacitive acceleration sensor according to Embodiment 2, by providing, at the position of the second sealing substrate 16 where the approximate center of the mass body 4 faces, the protrusion 15 protruding towards the mass body 4, the contact portion 17 of the second sealing substrate 16 with which the mass body 4 comes into contact, when the mass body 4 is displaced towards the second sealing substrate 16, has been configured in such a way that the center of the mass body 4 comes into contact with the second sealing substrate 16; therefore, the sticking force, for example, being generated by the anodic bonding of the second sealing substrate 16 to the bonding frame 2, in which the mass body 4 is intended to be stuck to the second sealing substrate 16 decreases. Accordingly, the sticking of the mass body 4 to the second sealing substrate 16 can be prevented. Therefore, the yield of the product is improved. Moreover, according to this Embodiment 2, because excessive displacement of the mass body 4 is prevented, the beams 7 supporting the mass body 4 is never destroyed caused by vibration or impact during the production or the transport process. Accordingly, the production yield can be more improved. Moreover, the protrusion 15 and the dent 18 can also be formed by the same sandblast method, etc.; therefore, neither new facilities nor new processes are needed to be added, and existing facilities and processes can be utilized. Accordingly, the production cost can be reduced in addition to the improvement of the production yield.

Moreover, in the capacitive acceleration sensor according to Embodiment 2, at the position where the mass body 4 comes into contact with the second sealing substrate 16, the contact portion 17 of the second sealing substrate 16 has been set so that the sticking force by which the mass body 4 is stuck to the second sealing substrate 16 becomes lower than the recovery force, due to the elasticity of the beams 7, that is intended for taking the mass body 4 away from the contact position and setting it back to the predetermined position; therefore, the sticking of the mass body 4 to the second sealing substrate 16 can be more securely prevented. Accordingly, the production yield is more improved.

Here, according to Embodiment 2, the protrusion 15 has been represented that comes into contact with the center of the mass body 4; however, this contact position is not limited to the center of the mass body 4. The protrusion 15 may be provided so as to come into contact with at least a part of the mass body 4.

In Embodiment 2, the configuration has been represented in which the protrusion 15 is provided in such a way that only the center of the mass body 4 comes into contact with the second sealing substrate 16. In the production process represented in Embodiment 2, the anodic bonding is performed between the second sealing substrate 16 and the bonding frame 2, after the mass body 4 has been formed; therefore, the explanation has been performed as means for preventing that the mass body 4 being possible to be displaced, when the anodic bonding is performed, is displaced towards the second sealing substrate 16 and stuck thereto.

Figure 14:
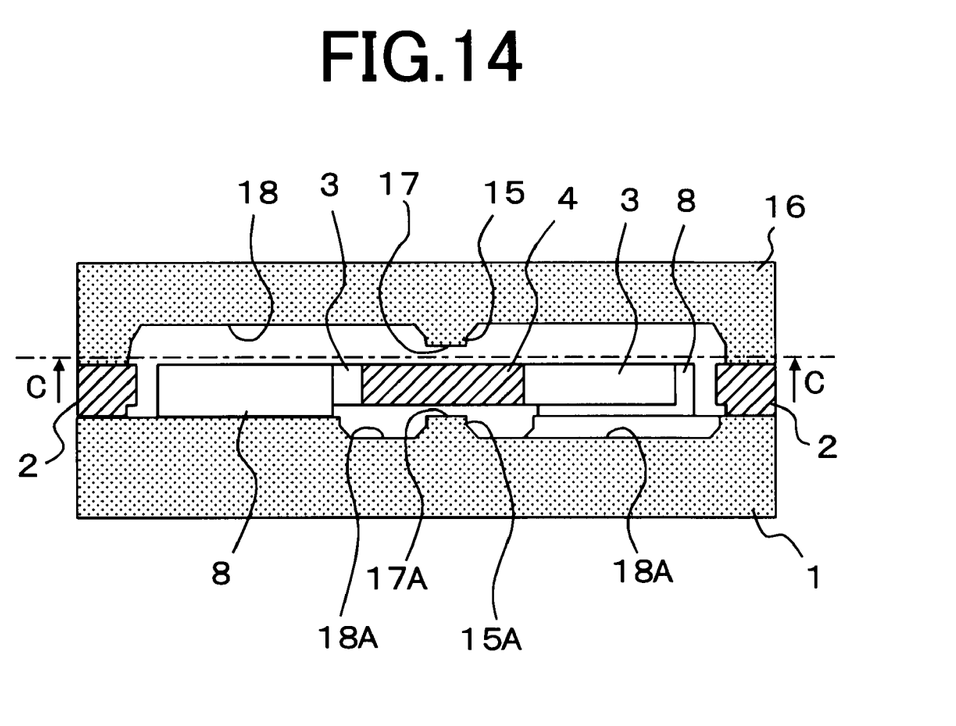
FIG. 14 is a cross-sectional view illustrating another example of the capacitive acceleration sensor according to Embodiment 2 of the present invention.

However, in a case of the first sealing substrate 1 being made of glass, when the first sealing substrate 1 and the bonding frame 2 are anodically bonded with each other, if the mass body 4 has already been formed, the mass body 4 is considered to be displaced towards the first sealing substrate 1 and stuck thereto. In such case, as illustrated in FIG. 14, a protrusion 15A may be provided so that only the center of the mass body 4 comes into contact with the first sealing substrate 1 (a contact portion is denoted by symbol 17A).

In conclusion, due to the sticking force generated by the anodic bonding performed between the bonding frame 2 and the second sealing substrate 16 or the first sealing substrate 1, when the mass body 4 is displaced towards the second sealing substrate 16, the protrusion 15 is formed on the second sealing substrate 16, and the contact portion 17 with which the center of the mass body 4 comes into contact is provided. While, when the mass body 4 is displaced towards the first sealing substrate 1, the protrusion 15A is formed on the first sealing substrate 1, and the contact portion 17A with which the center of the mass body 4 comes into contact is provided. Moreover, when the mass body 4 is displaced towards both of the second sealing substrate 16 and the first sealing substrate 1, the protrusions 15 and 15A are formed on the second sealing substrate 16 and the first sealing substrate 1, respectively, and the contact portions 17 and 17A, with which the center of the mass body 4 comes into contact, may be provided, respectively. Similar effect to that represented in Embodiment 2 can also be obtained in both cases. Here, when the protrusion 15A is formed on the first sealing substrate 1, a dent 18A having the depth that agrees with the hemline of the protrusion 15A is provided.

Moreover, in Embodiment 2, means for preventing the mass body 4 from being stuck to the second sealing substrate 16 or the first sealing substrate 1, due to potential difference, being generated when the anodic bonding is performed, between the mass body 4 and the second sealing substrate 16 or the first sealing substrate 1, has been specifically described. However, also in a case in which, caused by any factor, not limited by the anodic bonding, for example, but by static electricity generated during the production or the transport process, for example, the potential difference is generated between the mass body 4 and the second sealing substrate 16 or the first sealing substrate 1, and consequently, the sticking force towards the second sealing substrate 16 or the first sealing substrate 1 acts on the mass body 4, it is needless to say that the measure proposed here may effectively operates.

What is claimed is:

1. A capacitive acceleration sensor including a first sealing substrate and a second sealing substrate each made of glass, the sensor comprising therebetween:
   an acceleration detecting portion, made of silicon, including:
      a mass body supported in the air to have predetermined gaps each to the first sealing substrate and to the second sealing substrate,
      a beam, connected to the mass body for supporting the mass body in the air, having elasticity to enable the mass body to be displaced, and
      a fixed electrode provided to face the mass body with a predetermined gap thereto;
   a bonding frame, made of silicon, provided so as to surround the periphery of the acceleration detecting portion; and
   one of the first sealing substrate and the second sealing substrate including, at a position thereof facing the mass body, a contact portion with which only at least one peripheral portion of the mass body comes into contact, the contact portion being level with a portion of the one of the first sealing substrate and the second sealing substrate facing the fixed electrode in a direction parallel with the mass body.

2. A capacitive acceleration sensor as recited in claim 1, wherein the one of the first sealing substrate and the second sealing substrate including the contact portion is provided with a concavity at a position thereof facing the mass body, to contact the at least one peripheral portion of the mass body.

3. A capacitive acceleration sensor including a first sealing substrate and a second sealing substrate each made of glass, the sensor comprising therebetween:
   an acceleration detecting portion, made of silicon, including:
      a mass body supported in the air to have predetermined gaps each to the first sealing substrate and to the second sealing substrate,
      a beam, connected to the mass body for supporting the mass body in the air, having elasticity to enable the mass body to be displaced, and
      a fixed electrode provided to face the mass body with a predetermined gap thereto;
   a bonding frame, made of silicon, provided so as to surround the periphery of the acceleration detecting portion, wherein
   at least one of the first sealing substrate and the second sealing substrate including a contact portion with a protrusion at a position thereof facing the mass body, to contact only a center of the mass body.

4. A capacitive acceleration sensor as recited in any one of claims 1 through 3, wherein a contact range of the contact portion with which the mass body comes into contact is determined, in such a way that at the position where the mass body comes into contact with the contact portion, sticking force by which the mass body is stuck to the contact portion becomes lower than recovery force due to the elasticity of the beam that is intended for taking the mass body away from the contact portion.

5. A capacitive acceleration sensor including a first sealing substrate made of silicon, and a second sealing substrate made of glass, the sensor comprising therebetween:
   an acceleration detecting portion, made of silicon, including:
      a mass body supported in the air to have predetermined gaps each to the first sealing substrate and to the second sealing substrate,
      a beam, connected to the mass body for supporting the mass body in the air, having elasticity to enable the mass body to be displaced, and
      a fixed electrode provided to face the mass body with a predetermined gap thereto;

a bonding frame, made of silicon, provided to surround the periphery of the acceleration detecting portion; and the second sealing substrate including, at a position thereof facing the mass body a contact portion with which a part of the mass body comes into contact, wherein the second sealing substrate is provided with a concavity at a position thereof facing the mass body, to contact only at least one peripheral portion of the mass body, the contact portion being level with a portion of the second sealing substrate facing the fixed electrode in a direction parallel with the mass body.

6. A capacitive acceleration sensor as including a first sealing substrate made of silicon, and a second sealing substrate made of glass, the sensor comprising therebetween:

an acceleration detecting portion, made of silicon, including:

a mass body supported in the air to have predetermined gaps each to the first sealing substrate and to the second sealing substrate, a beam, connected to the mass body for supporting the mass body in the air, having elasticity to enable the mass body to be displaced, and a fixed electrode provided to face the mass body with a predetermined gap thereto;

a bonding frame, made of silicon, provided to surround the periphery of the acceleration detecting portion; and the second sealing substrate including, at a position thereof facing the mass body a contact portion with which a part of the mass body comes into contact, wherein the second sealing substrate is provided with a protrusion at the contact portion thereof facing the mass body, to contact only a center of the mass body.

7. A capacitive acceleration sensor as recited in any one of claim 5 or 6, wherein a contact range of the contact portion with which the mass body comes into contact is determined, in such a way that at the a position where the mass body comes into contact with the contact portion, sticking force by which the mass body is stuck to the contact portion becomes lower than recovery force due to the elasticity of the beam that is intended for taking the mass body away from the contact portion.

8. A capacitive acceleration sensor as recited in claim 1, wherein the at least one of the first sealing substrate and the second sealing substrate including the contact portion is anodically bonded to the bonding frame.

9. A capacitive acceleration sensor as recited in claim 2, wherein the depth of the concavity is such that the mass body is prevented from contacting the deepest part of the concavity.

* * * * *